United States Patent
Quercia et al.

(10) Patent No.: US 8,183,521 B2
(45) Date of Patent: May 22, 2012

(54) OPTOELECTRONIC MODULE PROVIDED WITH A FLEXIBLE SUBSTRATE AND AT LEAST ONE PHOTORECEPTOR CIRCUIT INCORPORATED INTO A COMPUTER MOUSE

(75) Inventors: Victorio Quercia, Vallamond (CH); André Grandjean, Cressier (CH); Abdul-Hamid Kayal, Neuchâtel (CH)

(73) Assignee: EM Microelectronic-Marin S.A., Marin (CH)

( * ) Notice: Subject to any disclaimer, the term of this patent is extended or adjusted under 35 U.S.C. 154(b) by 1101 days.

(21) Appl. No.: 12/030,996

(22) Filed: Feb. 14, 2008

(65) Prior Publication Data
US 2008/0204416 A1 Aug. 28, 2008

(30) Foreign Application Priority Data
Feb. 22, 2007 (CH) .................................. 0308/07

(51) Int. Cl.
*H01J 5/02* (2006.01)
*H01J 40/14* (2006.01)

(52) U.S. Cl. .................................. 250/239; 250/214 R

(58) Field of Classification Search .............. 250/214.1, 250/214 R, 221, 239, 208.1, 206, 216, 222.1, 250/231.1; 345/161, 163–167; 257/257, 257/258, 290, 291, 428, 431–436, 443, 444; 382/312–314, 316, 321; 385/14, 15, 33, 385/92
See application file for complete search history.

(56) References Cited

U.S. PATENT DOCUMENTS

| | | | |
|---|---|---|---|
| 5,023,498 A | 6/1991 | Abe | |
| 5,285,062 A * | 2/1994 | Lee | 250/216 |
| 5,783,818 A * | 7/1998 | Manabe et al. | 250/239 |
| 7,034,278 B2 * | 4/2006 | Tschirren et al. | 250/221 |
| 2002/0088987 A1 | 7/2002 | Sakurai | |
| 2002/0134750 A1 | 9/2002 | Blom | |
| 2003/0142075 A1* | 7/2003 | Chin | 345/163 |
| 2004/0095501 A1 | 5/2004 | Aizawa et al. | |
| 2004/0142539 A1 | 7/2004 | Koizumi | |

(Continued)

FOREIGN PATENT DOCUMENTS

EP 1 081 944 A2 3/2001
(Continued)

OTHER PUBLICATIONS

Swiss search report issued in corresponding application No. CH 0308/07, dated Mar. 29, 2007.
European Search Report issued in corresponding application No. EP 08 15 0841, completed Jun. 19, 2008.

*Primary Examiner* — Que T Le
*Assistant Examiner* — Jennifer Bennett
(74) *Attorney, Agent, or Firm* — Griffin & Szipl, P.C.

(57) ABSTRACT

The optoelectronic module includes a photoreceptor circuit for picking up light from a light source by reflection on an external surface. The photoreceptor circuit and the light source circuit are mounted on a substrate, and contact pads of the circuits are electrically connected to pads of the substrate. The substrate pads are connected to conductive paths of the substrate. The flexible substrate includes a first portion on which the photoreceptor circuit and light source circuit are mounted and electrically connected, a second portion including electrical connection terminals and a connecting portion between the first portion and the second portion. This connecting portion connects some conductive paths of the first portion to the connection terminals of the second portion. The connecting portion allows the height and/or spacing of the second portion to be adjusted relative to the first portion when the module is mounted, particularly in a computer mouse.

5 Claims, 3 Drawing Sheets

U.S. PATENT DOCUMENTS

| | | |
|---|---|---|
| 2004/0234190 A1 | 11/2004 | Omori |
| 2005/0002618 A1 | 1/2005 | Miyamae et al. |
| 2005/0018978 A1 | 1/2005 | Nevo et al. |
| 2005/0078085 A1 | 4/2005 | Casebolt et al. |
| 2005/0152634 A1* | 7/2005 | Okamoto et al. ............... 385/14 |
| 2006/0007148 A1* | 1/2006 | Theytaz et al. ............... 345/163 |
| 2006/0062526 A1 | 3/2006 | Ikeuchi |
| 2007/0146318 A1* | 6/2007 | Juh et al. ....................... 345/157 |

FOREIGN PATENT DOCUMENTS

| | | |
|---|---|---|
| EP | 1 339 012 A1 | 8/2003 |
| EP | 1 361 537 A1 | 11/2003 |
| WO | 2005/088435 A1 | 9/2005 |
| WO | WO2006093388 A1 * | 3/2006 |

* cited by examiner

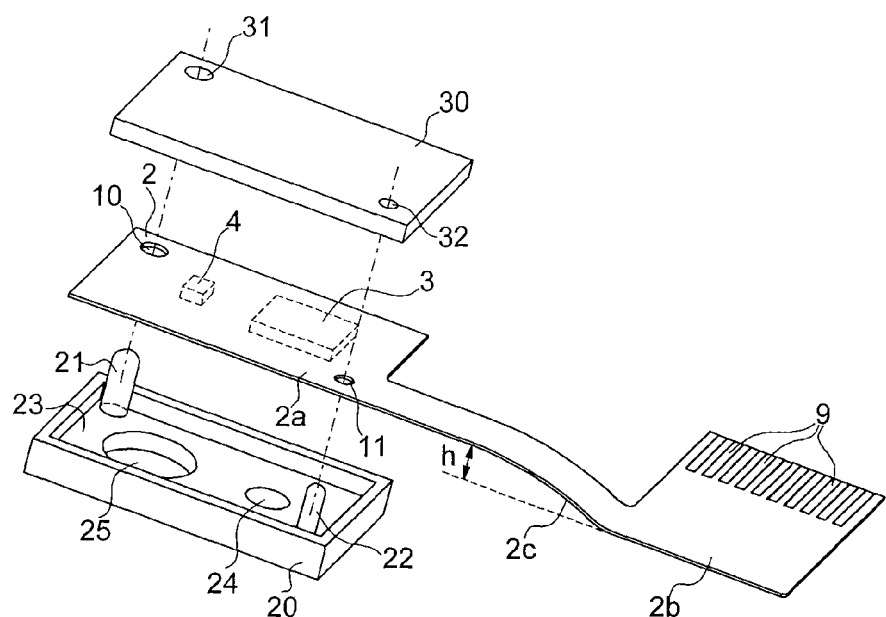
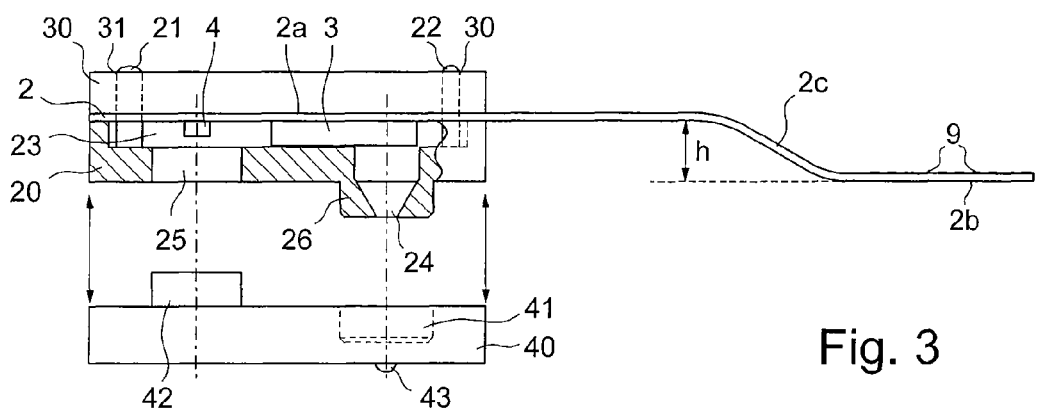
Fig. 2
Fig. 3

OPTOELECTRONIC MODULE PROVIDED WITH A FLEXIBLE SUBSTRATE AND AT LEAST ONE PHOTORECEPTOR CIRCUIT INCORPORATED INTO A COMPUTER MOUSE

This application claims priority from Swiss Patent Application No. 00308/07 filed Feb. 22, 2007, the entire disclosure of which is incorporated herein by reference.

FIELD OF THE INVENTION

The invention concerns an optoelectronic module provided with at least one photoreceptor circuit able to pick up light originating from a light source directly or by reflection on an external surface. The photoreceptor circuit is mounted on a substrate, and contact pads of the photoreceptor circuit are electrically connected to corresponding pads of the substrate. The substrate pads are connected to conductive paths to form a printed circuit board.

The invention also concerns a computer mouse including an optoelectronic module of this type.

BACKGROUND OF THE INVENTION

In the optical computer mouse field, the optoelectronic module can include at least one photoreceptor circuit mounted on a substrate and enclosed in an opaque plastic mould or encapsulated. A light passage is made in the plastic mould in the shape of a diaphragm above a photosensitive area of the photoreceptor circuit. This light passage thus enables the circuit to pick up the light generally reflected on a work surface of the computer mouse. This light is produced by a light source arranged in the computer mouse case. The light source may also be a light source circuit mounted on the substrate below a through aperture of the plastic optoelectronic module mould.

Usually, a state of the art optoelectronic module for a computer mouse takes the form of a standard encapsulated DIL type component, as disclosed for example in EP Patent Application Nos. 1 339 012 and 1 361 537. This component includes regularly spaced pins coming out of a plastic mould inside which the photoreceptor circuit and possibly a light source circuit are arranged. The connection pins of the module can be inserted in metallised holes of a mother printed circuit board housed inside the computer mouse. An aperture in the mother printed circuit board is also provided between the connection pins of the module in order to allow the emission of light from the light source circuit and the reception of light reflected by the photoreceptor circuit.

This optoelectronic module may include or be mounted on a transparent optical lens unit, which is preferably secured above a wide aperture in the bottom of the computer mouse case. It is thus important to adjust the height of the optoelectronic module, mounted on the transparent optical lens unit, on the mother board relative to the work surface or to the bottom of the computer mouse case. This adjustment of the module height relative to the mother board is carried out prior to electrical connection for example by welding the connecting pins of said module in the metallised holes of the board. In some cases, a part of the connecting pins that overshoots the metallised holes, can be cut. Such operations prove relatively long and thus expensive, and are difficult to implement in practice for mounting the optoelectronic module in the computer mouse case, which is a drawback.

The optoelectronic module made in the form of a DIL type component is moreover relatively voluminous given that the spacing of the connecting pins is well defined, which is another drawback. Moreover, only the height of the module can be adjusted to secure it as a function of the spacing between the mother board and the bottom of the mouse case onto which the transparent optical lens unit might be secured. This also requires adjustment of the mother board relative to the place where the transparent optical lens unit of the optoelectronic module is to be secured or placed, which is disadvantageous.

SUMMARY OF THE INVENTION

It is thus a main object of the invention to provide an optoelectronic module, which overcomes the aforecited drawbacks of the prior art, and which is relatively compact and can be adjusted in height and/or in the plane of the substrate to facilitate the assembly thereof in the case of an electronic instrument, such as a computer mouse.

The above object is solved according to the present invention by the characteristics of an optoelectronic module, characterized in that the optoelectronic module includes at least one photoreceptor circuit able to pick up light originating from a light source directly or via reflection on an external surface, the photoreceptor circuit being mounted on a substrate, contact pads of the photoreceptor circuit being electrically connected to corresponding pads of the substrate, which are connected to conductive paths of the substrate, wherein the substrate is a flexible substrate, which includes a first portion on which the photoreceptor circuit is mounted and electrically connected, a second portion including electrical connection terminals and a connecting portion between the first portion and the second portion for connecting some conductive paths of the first portion to the connection terminals of the second portion, the connecting portion allowing the height and/or spacing of the second portion to be adjusted relative to the first portion. Additional, particular beneficial, embodiments of the present invention are provided in accordance with the following subsidiary optoelectronic modules.

In accordance with a second optoelectronic module embodiment of the present invention, the first embodiment is modified so that the contact pads of the photoreceptor circuit are connected by metal connecting wires to the corresponding pads of the first portion of the flexible substrate, and wherein the photoreceptor circuit includes a first photosensitive area for picking up the light received and a second area juxtaposed with a unit for processing signals supplied by the first area. In accordance with a third optoelectronic module embodiment of the present invention, the first embodiment is modified so that a light source circuit is mounted on the same face of the first portion of the flexible substrate as the photoreceptor circuit, and wherein the light source circuit is electrically connected via at least two conductive paths of the first portion to at least two contact pads of the photoreceptor circuit. In accordance with a fourth optoelectronic module embodiment of the present invention, the first embodiment is modified so that metal bumps are made on the contact pads of the photoreceptor circuit in order to be directly connected to the corresponding pads of the substrate arranged in the same arrangement as the metal bumps, wherein the photoreceptor circuit includes a first photosensitive area for picking up the light received and a second area juxtaposed with the unit for processing signals provided by the first area, and wherein a light passage aperture is provided through the first portion of the flexible substrate opposite the first photosensitive area. In accordance with a fifth optoelectronic module embodiment of the present invention, the fourth embodiment is modified so that a light source circuit is mounted on the first portion of the flexible substrate on a face opposite the face of the photoreceptor circuit, and wherein the light source circuit is electrically connected via at least two conductive paths passing through the first portion to at least two contact pads of the photoreceptor circuit. In accordance with a sixth optoelectronic module embodiment of the present invention, the first embodiment is modified so that the connecting portion of the flexible substrate is made in an L shape between the first and second portions, wherein the width of the connecting portion is less than the width of one side of the first portion from which the connecting portion is connected, preferably less than half the width of the first portion. In accordance with a seventh optoelectronic module embodiment of the present invention, the sixth embodiment is modified so that the length of the connecting portion is comprised between half and twice the length of the first portion. In accordance with a eighth optoelectronic module embodiment of the present invention, the first embodiment is modified so that it includes an opaque cover arranged on the first portion of the flexible substrate on the side of the photoreceptor circuit, wherein the cover includes a light passage arranged above a photosensitive area of the photoreceptor circuit and made in an external projecting part of the cover. In accordance with a ninth optoelectronic module embodiment of the present invention, the eighth embodiment is modified so that the cover includes two positioning pins arranged in proximity to two diametrically opposite corners inside a housing for the photoreceptor circuit, wherein each pin, which extends from the bottom of the housing towards the exterior of the housing, is of generally cylindrical shape and has a different shape from the other pin, and wherein the first portion of the flexible substrate includes a first hole whose diameter corresponds to the diameter of one of the pins, and a second hole, whose diameter corresponds to the diameter of the other pin in order for the pins to pass therethrough in a well defined orientation and position. In accordance with a tenth optoelectronic module embodiment of the present invention, the ninth embodiment is modified so that a light source circuit is mounted in the housing of the cover on the same face of the first portion of the flexible substrate as the photoreceptor circuit, and wherein the cover includes an aperture for the passage of the light generated by the light source, said aperture being provided for receiving an optical lens portion of a transparent unit, and of larger dimensions than the transmission surface of the light source circuit. In accordance with a eleventh optoelectronic module embodiment of the present invention, the eighth embodiment is modified so that it includes an opaque plate fitted with two through holes of the same diameter as the holes in the flexible substrate and positioned in the same manner as the holes of the flexible substrate, in order for the two pins of the cover to pass therethrough to enclose the first portion of the substrate between the cover and the plate. In accordance with a twelfth optoelectronic module embodiment of the present invention, the eighth embodiment is modified so that a transparent unit of complementary shape to the external surface of the cover is mounted on one part of the external surface of the cover, and wherein the transparent unit includes at least one lens arranged on the light passage above the projecting part on the photosensitive area of the photoreceptor circuit.

One advantage of the optoelectronic module according to the invention is that it includes a flexible substrate with a first portion carrying at least the photoreceptor circuit, a second portion with electrical connection terminals, and a portion connecting the first and second portions. Because of this connecting portion, it is possible to adjust the height of the first portion relative to the second portion, and also to adjust the spacing between the first and second portions of the flexible substrate. Because of the flexible substrate, it is possible to position the photoreceptor circuit of the first substrate portion on a transparent optical lens unit independently of the position of the place of connection of the module connecting terminals of the second substrate portion.

If the optoelectronic module is mounted in a computer mouse, the transparent optical lens unit is fixed onto an aperture in the bottom of the computer mouse case. The first flexible substrate portion with the photoreceptor circuit, enclosed in part under a cover, is directly mounted on the transparent unit. The height of the second flexible substrate portion with the connecting terminals can be freely adjusted relative to the first substrate portion in order to connect to a mother printed circuit board. The space between the first portion and the second portion can also be adjusted owing to the connecting portion. This space can be comprised between a maximum space corresponding to the length of the connecting portion and a minimum space of proximity between the first portion and the second portion of the flexible substrate. Consequently, the optoelectronic module can easily be mounted in any type of computer mouse independently of the precise position of the mother board relative to the aperture in the bottom of the mouse case.

Advantageously, an opaque cover is arranged on the first portion of the flexible substrate on the photoreceptor circuit side. A light passage through the cover is provided above a photosensitive area of the photoreceptor circuit, while a processing unit area of the circuit is protected from the light. This light passage may be in an external projecting part of the cover.

Advantageously, the cover includes two positioning pins in an inner housing in which the photoreceptor circuit is placed, and possibly another light source circuit. These pins are arranged in proximity to two diametrically opposite corners inside a housing. Each pin extends from the bottom of the housing towards the outside of the housing. The pins are of generally cylindrical shape and of different diameter to each other to act as a polarizing slot during assembly onto the first portion of the flexible substrate. In order to do this, the first portion of the flexible substrate includes two holes of different diameter corresponding to the diameter of each pin, and positioned such that the pins pass therethrough when the cover is mounted on the first portion.

The above object is also solved according to the present invention by the characteristics of a computer mouse, which includes an optoelectronic module, characterized in that the computer mouse includes in a case, a mother printed circuit board at a distance from a bottom of the case, wherein the transparent lens unit of the module is secured to the bottom of the case above a through aperture made in the bottom of the case for the passage and reception of light, wherein the assembly formed of the cover and the first portion of the flexible substrate is secured inside the case on the transparent unit and arranged in part inside a through aperture in the mother board, and wherein the connecting terminals of the second portion of the flexible substrate are connected to corresponding connecting pads of the mother board next to the through aperture in said board, the height and/or the spacing of the second portion being adjusted via the connecting portion, and with respect to the first portion of the flexible substrate, and as a function of the space between the mother board and the bottom of the case.

BRIEF DESCRIPTION OF THE DRAWINGS

The objects, advantages and features of the optoelectronic module will appear more clearly in the following description of non-limiting embodiments illustrated by the drawings, in which:

FIG. 2 shows an exploded three dimensional view of a second embodiment of the optoelectronic module according to the invention, FIG. 3 shows a partial longitudinal cross-sectional side view of a third embodiment of the optoelectronic module with a transparent optical lens unit according to the invention.

DETAILED DESCRIPTION OF THE INVENTION

In the following description, all of the parts of the optoelectronic module, which are well known to those skilled in the art in this technical field, are related in only a simplified manner. Preferably, the optoelectronic module is made for use in a computer mouse, but one could envisage using this optoelectronic module in any other electrical instrument or apparatus.

Figure 1:
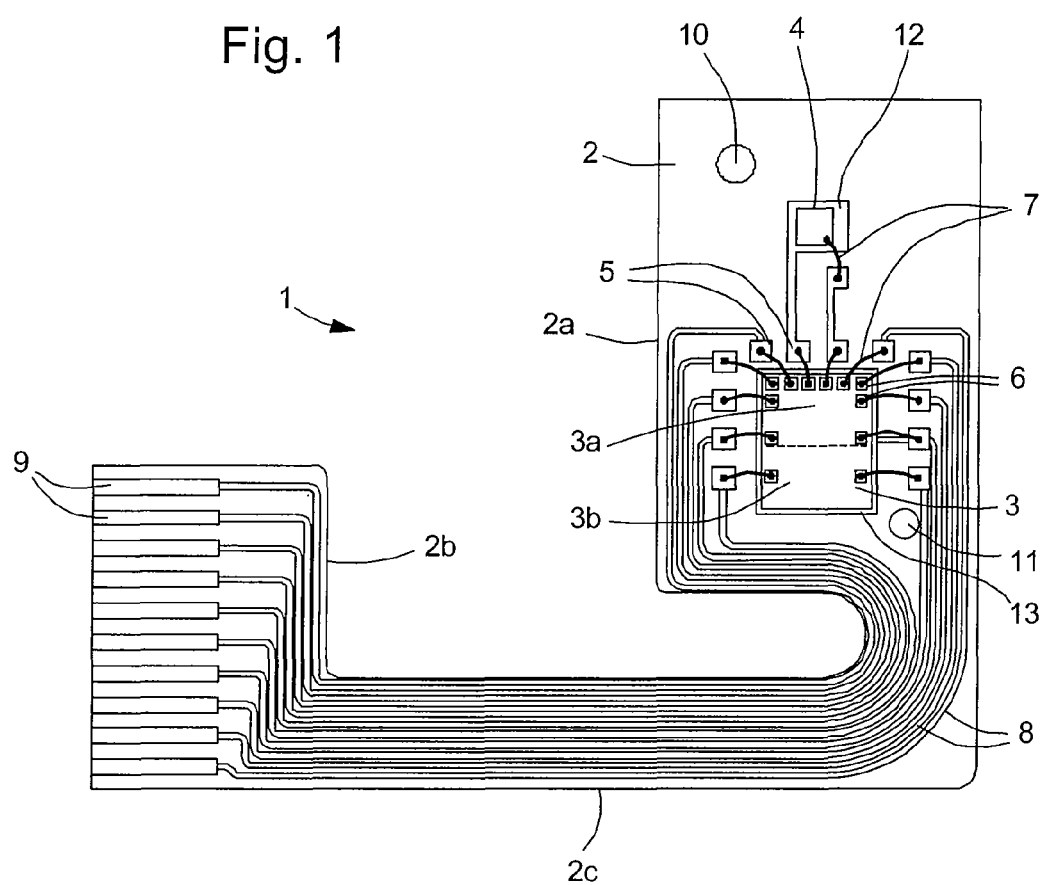
FIG. 1 shows a top view of a first embodiment of an optoelectronic module according to the invention.

FIG. 1 shows a top view of optoelectronic module 1 for example to be fitted to a computer mouse. This optoelectronic module 1 includes on a first face of the same flexible substrate 2, an integrated photoreceptor circuit 3 for picking up light generated by an integrated light source circuit 4, particularly by reflection on an external work surface. Photoreceptor circuit 3 and light source circuit 4 are mounted on a first portion 2a of flexible substrate 2. Contact pads 6 of photoreceptor circuit 3 are electrically connected by metal wires 7, such as aluminium wires, to corresponding connecting pads 5 arranged on a first face of the substrate. These connecting pads 5 are connected to preferably metal conductive paths 8 of the substrate to form a printed circuit board. These conductive paths 8 can be arranged on either face of the flexible substrate.

Flexible substrate 2 has the shape of a flexible sheet whose thickness may be for example of the order of 75 μm. In addition to first portion 2a, this flexible substrate 2 also includes a second portion 2b including electrical connection terminals 9 and a connecting portion 2c between the first portion and second portion. These metal connecting terminals 9 are directly connected to some conductive paths 8 of the first portion via connecting portion 2c. In order to act as an electrical connection, these connecting terminals 9 can be arranged on the first face of the substrate, and on a second opposite face. A metal connection, for example through metallised holes, may be envisaged through second portion 2b of flexible substrate 2 in order to connect electrically the parts of connecting terminals 9 arranged on the two faces of the substrate.

The integrated light source circuit 4 used may be a laser diode or a light emitting diode. Normally, a first face of light source circuit 4 is directly connected across a specific connection pad 12 of the first substrate portion. However, a metal wire 7, such as a gold wire, connects one contact pad of a second opposite face of the light source circuit across another corresponding pad 5 of first portion 2a of flexible substrate 2. An opposite face relative to contact pads 6 of the photoreceptor circuit 3 can be also electrically connected to a large specific connection pad 13 on the first portion 2a of the flexible substrate 2. This specific connection pad 13 is connected to a conductive path to be connected to an electric supply terminal of the photoreceptor circuit, particularly earth, via connecting terminals 9.

It should be noted that light source circuit 4 is only electrically connected to contact pads 6 of photoreceptor circuit 3 via two metal paths 8 of first portion 2a. None of connecting terminals 9 of the second portion of the connector type is electrically connected to light source circuit 4. Thus, the light source circuit can be protected from any electrostatic discharge ESD by protective diodes made in photoreceptor circuit 3.

Photoreceptor circuit 3 includes a photosensitive area 3b juxtaposed with a processing unit area 3a for the signals provided by several photosensitive elements of photosensitive area 3b, which are not shown. Normally, processing unit area 3a of the photoreceptor circuit has to be sheltered from light. It can therefore be encapsulated in a conventional opaque resin with the various contact pads of the circuit and of the first portion, while leaving photosensitive area 3b uncovered to pick up light. In the second embodiment described hereafter with reference to FIG. 2, this processing unit area is protected from light using an opaque cover, preferably dark in colour, such as black.

Since this flexible substrate includes first and second portions 2a, 2b connected via a connecting portion 2c, it is possible to adjust the height and/or spacing of the second portion relative to the first portion. The height represents the distance separating the two planes formed by the first and second portions 2a and 2b. This provides a considerable advantage when optoelectronic module 1 is being mounted, particularly in a computer mouse as explained hereafter.

In order to mount first portion 2a of flexible substrate 2b on a support or a cover to partially enclose photoreceptor circuit 3, two positioning holes 10, 11 are provided, through the first portion. Since the shape of this first portion seen from above is substantially rectangular, each hole is positioned in proximity to two diametrically opposite corners of first portion 2a. These positioning holes are circular and of different diameter in order to act as a polarizing slot when the first portion is mounted onto two respective pins of one support, of different diameter, corresponding to that of each hole.

Connecting portion 2c of flexible substrate 2 may be made in an L shape between first and second portions 2a and 2b, seen in the same plane, with a curve at the corner of the L. The width of the connecting portion is less than the width of one side of first portion 2a from which the connecting portion is connected. Preferably, this width is less than half the width of the first portion. The total length of connecting portion 2c can be comprised between half and twice the length of first portion 2a.

Connecting portion 2c is connected to one side of first portion 2a slightly shifted relative to the centre of said side. This allows less curvature and thus less mechanical stress on the flexible substrate when optoelectronic module 1 is secured on the one hand to the mother board and on the other hand to the bottom of the case of a computer mouse. Moreover, the length of this connecting portion has to be chosen to minimise any effect of interference linked to the metal paths that it carries.

Of course, one could also envisage mounting photoreceptor circuit 3 on first portion 2a of flexible substrate 2 by a flip chip technique that is not illustrated. In order to do this, metal bumps are made on metal contact pads 6 of photoreceptor circuit 3 overshooting the passivating layer. These metal bumps are directly connected on corresponding pads of the substrate disposed in the same arrangement and position as the metal bumps. With this mounting technique, an aperture must also be provided in first portion 2a of flexible substrate 2 opposite photosensitive area 3b in order to receive light through this area. However, light source circuit 4 must be mounted on a face opposite the face carrying photoreceptor circuit 3. An electrical connection must therefore be provided through the first portion to connect light source circuit 4 to photoreceptor circuit 3.

It should be noted that if photoreceptor circuit 3 is mounted by this flip chip technique, it is possible to make first portion 2a of the flexible substrate less wide than the assembly shown in FIG. 1. In this way, a saving of space can be obtained in the computer mouse case by this type of optoelectronic module 1.

FIG. 2 shows an exploded three-dimensional view of a second embodiment of optoelectronic module 1. In this second embodiment, connecting part 2c of flexible substrate 2 is, for example, made in rectilinear form between first portion 2a and second portion 2b. However, a height adjustment h is shown in FIG. 2 between first portion 2a and second portion 2b via connecting portion 2c that has curved parts. Second portion 2b carries electrical connecting terminals 9, which are made on both faces of second portion 2b.

Optoelectronic module 1 thus includes photoreceptor circuit 3 and light source circuit 4 placed on the same face of first portion 2a of flexible substrate 2. This module further includes a cover 20 that is opaque to light, for example in black plastic, which is used for making first portion 2a of substrate 2 rigid and which is electrically insulating. Moreover, the module can include a bottom plate 30 on first portion 2a, made of the same material or a different material to the cover, which is rigid, opaque to light and electrically insulating. Cover 20 is thus arranged on first portion 2a of flexible substrate 2 on the side of photoreceptor circuit 3 and light source circuit 4. This cover includes a light passage 24, in the form of a diaphragm. Light passage 24 is arranged above the photosensitive area of photoreceptor circuit 3. The light passage is made in the cover from a part projecting outside the cover, not shown in FIG. 2.

The cover also includes an aperture 25 for the passage of the light generated by light source 4. This aperture 25, which is circular, is also provided for receiving an optical lens portion of a transparent optical lens unit, and is of larger dimensions than the transmission surface of the light source circuit.

Cover 20 also includes two parallel positioning pins 21 and 22, which are arranged in proximity to two diametrically opposite corners inside a housing 23. Photoreceptor circuit 3 and light source circuit 4 are protected inside this housing 23. Each pin, which extends vertically from the bottom of the housing towards the exterior of the housing, is of generally cylindrical shape and has a different diameter to the other pin. The length of each pin is thus larger than the depth of the housing in order to pass outside the housing.

The first portion 2a of the flexible substrate includes a first hole 10 whose diameter corresponds to the diameter of one of the pins 21, and a second hole 11 whose diameter corresponds to the diameter of the other pin 22. The pins pass through these two holes 10, 11 in an orientation and position that is well defined by the shape of the pins when cover 20 is mounted on first portion 2a. The length and width of the cover correspond to the length and width of first portion 2a of flexible substrate 2.

The optoelectronic module may also include a plate 30 that is opaque to light, made of the same material or a different material from the cover, which is arranged on one face of first portion 2a opposite that of the cover. The first portion 2a is thus sandwiched between cover 20 and said plate 30 in order to made this part of the module rigid. This plate also includes two through holes 31, 32, which have the same position and same diameter as holes 10, 11 of first portion 2a of flexible substrate 2. Pins 21, 22, whose free end may be rounded or chamfered in order to facilitate introduction into each hole, also pass through the holes in the plate. Once the plate is mounted with the first portion on the cover, the ends of the pins can be secured to the plate by suitable heating or bonding.

FIG. 3 shows a partial side longitudinal cross-section of a third embodiment of optoelectronic module 1. The only difference in this third embodiment of optoelectronic module 1 relative to the module shown in FIG. 2 is that it includes another transparent optical lens unit 40 shown prior to being secured to cover 20.

It should be noted that in this FIG. 3, all of the elements of optoelectronic module 1 bear identical reference numbers to the same elements described with reference to FIGS. 1 and 2. Consequently, for the sake of simplicity, the description of each element will not be repeated for this third embodiment.

Cover 20 partially shown in cross-section, includes an external projecting part 26 of cylindrical shape. A light passage 24 is thus made in the form of a diaphragm for receiving light via the photosensitive area of the photoreceptor circuit. Light is generated by the light source circuit 4 and reflected onto a work surface to be received through the light passage by the photosensitive area of photoreceptor circuit 3.

Transparent optical lens unit 40 is mounted on an external surface of cover 20. The surface of this transparent unit, which comes into contact on cover 20, may be of complementary shape to the external surface of the cover. Thus, one part of the transparent unit in the shape of a lens 42 may be housed in housing 25 of the cover above light source circuit 4. Moreover, a complementary part 41 of the transparent unit covers projecting part 26 of cover 20. A lens 43 can be formed in the transparent unit just above light passage 24.

This transparent unit thus blocks aperture 25 and passage 24 in order also to protect the two circuits 3, 4 in housing 23 from dust and environmental conditions. This transparent unit 40 may be made of glass or preferably plastic. The transparent unit can be secured to the cover with adhesive or using hooking means that are not shown.

Figure 4:
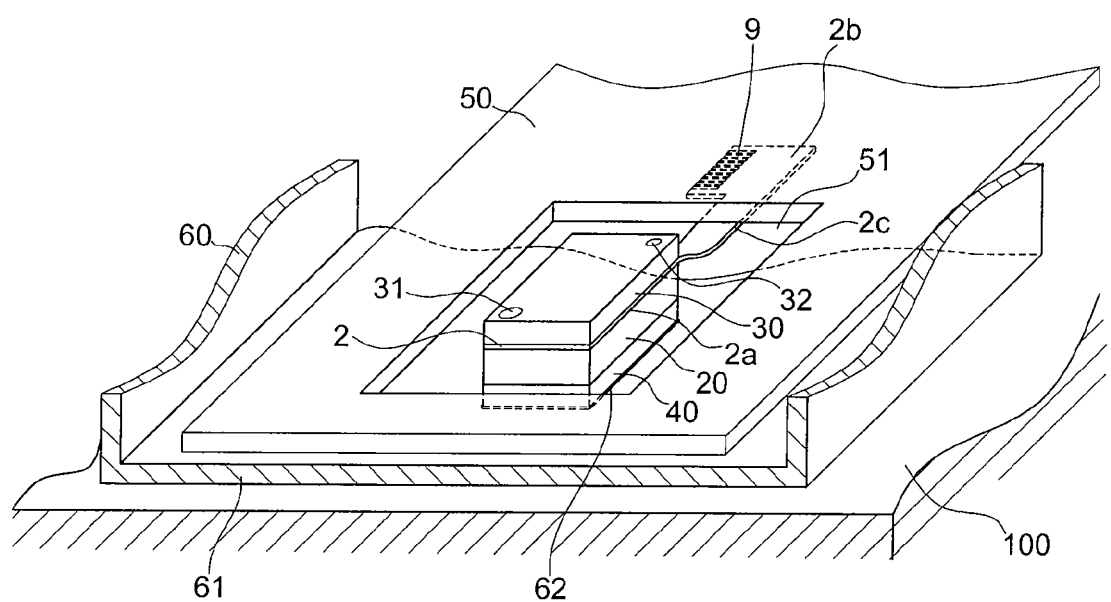
FIG. 4 shows a simplified three dimensional partial cross-section of one part of a computer mouse, which includes the optoelectronic module according to the invention, on a work surface.

The complete optoelectronic module 1 can thus be fitted to a computer mouse 60 as shown in a simplified manner and partially in cross-section in FIG. 4. The case of the optical mouse 60 includes a bottom 61 placed on a work surface 100. As above, most of the elements of the module that bear the same reference numbers will not be explained for the sake of simplification.

The optoelectronic module is mounted inside the case of mouse 60 above the bottom 61 of said case. The transparent optical lens unit 40, which is secured to cover 20, is placed on an aperture 62 of the bottom 61 of the mouse case, which may have a surface area equal to the top surface area of the transparent unit. This transparent unit may be hooked or fixed to the bottom 61 of the case. Because this unit is fixed to the bottom of the case, the position of first portion 2a of flexible substrate 2, which is held between plate 30 and cover 20, is well defined.

The assembly, which includes cover 20, first portion 2a of substrate 2 and plate 30 is placed in part through a through aperture 51 of a mother printed circuit board 50. This mother board is secured in the case of mouse 60 at a defined distance from bottom 61, which may be different from one type of mouse to another. Thus, because of connecting portion 2c of flexible substrate 2, which is free to bend, the connecting terminals 9 of second portion 2b can easily be connected to corresponding connecting pads of the mother board close to through aperture 51. Consequently, the height and spacing between first portion 2a and second portion 2b can be adjusted via connecting portion 2c independently of the type of computer mouse in which the optoelectronic module is mounted.

From the description that has just been given, those skilled in the art can devise multiple variants of the optoelectronic module without departing from the scope of the invention defined by the claims. The connecting portion can be an angular part or a hinge between the first and second portions of the flexible substrate. The second portion can be secured to a mother board perpendicularly to the first portion by twisting the connecting portion.

What is claimed is:

1. The computer mouse including an optoelectronic module, wherein the optoelectronic module includes: (a) a light source circuit; (b) at least one photoreceptor circuit configured to pick up light originating from the light source circuit directly or via reflection on an external surface, having contact pads; (c) a flexible substrate on which the photoreceptor circuit is directly mounted, wherein the substrate includes—a first portion on which the photoreceptor circuit is mounted and electrically connected, having contact pads corresponding to the contact pads of the photoreceptor circuit, —a second portion including electrical connection terminals, and—a connecting portion between the first portion and the second portion, having conductive paths, wherein the contact pads of the photoreceptor circuit are electrically connected to the corresponding contact pads of the first portion, which are connected to the electrical connection terminals of the second portion via the connection paths of the connecting portion, wherein the connecting portion allows a height and/or spacing of the second portion to be adjusted relative to the first portion, wherein the width of the connecting portion is less than half the width of one side of the first portion from which the connecting portion is connected, and the connection portion is shifted relative to the center of the side of the first portion, wherein the optoelectronic module further includes an opaque cover arranged on the first portion of the flexible substrate on a side of the photoreceptor circuit, wherein the cover includes a light passage arranged above a photosensitive area of the photoreceptor circuit and made in an external projecting part of the cover, wherein a transparent unit of complementary shape to the external surface of the cover is mounted on one part of an external surface of the cover, and wherein the transparent unit includes at least one lens arranged on the light passage above the projecting part on the photosensitive area of the photoreceptor circuit, wherein the computer mouse further includes, in a case, a mother printed circuit board at a distance from a bottom of the case, wherein the transparent lens unit of the optoelectronic module is secured to the bottom of the case above a through aperture made in the bottom of the case for the passage and reception of light, wherein an assembly formed of the cover and the first portion of the flexible substrate is secured inside the case on the transparent unit and arranged in part inside a through aperture made in the mother printed circuit board, wherein the connecting terminals of the second portion of the flexible substrate are connected to corresponding connecting pads of the mother printed circuit board next to the through aperture made in the mother printed circuit board, wherein the height and/or the spacing of the second portion is adjusted via the connecting portion, with respect to the first portion of the flexible substrate and as a function of the space between the mother printed circuit board and the bottom of the case.

2. An optoelectronic module, including
(a) a light source circuit;
(b) at least one photoreceptor circuit pickable configured to pick up light originating from the light source circuit directly or via reflection on an external surface, having contact pads;
(c) a flexible substrate on which the photoreceptor circuit is directly mounted, wherein the substrate includes
a first portion on which the photoreceptor circuit is mounted and electrically connected, having contact pads corresponding to the contact pads of the photoreceptor circuit,
a second portion including electrical connection terminals, and
a connecting portion between the first portion and the second portion, having conductive paths,
wherein the contact pads of the photoreceptor circuit are electrically connected to the corresponding contact pads of the first portion, which are connected to the electrical connection terminals of the second portion via the connection paths of the connecting portion,
wherein the connecting portion allows a height and/or spacing of the second portion to be adjusted relative to the first portion,
wherein the width of the connecting portion is less than half the width of one side of the first portion from which the connecting portion is connected, and the connection portion is shifted relative to the center of the side of the first portion,
wherein metal bumps are made on the contact pads of the photoreceptor circuit in order to be directly connected to the corresponding pads of the substrate arranged in the same arrangement as the metal bumps, wherein the photoreceptor circuit includes a first photosensitive area for picking up the light received and a second area juxtaposed with the unit for processing signals provided by the first area, and wherein a light passage aperture is provided through the first portion of the flexible substrate opposite the first photosensitive area, and
wherein a light source circuit is mounted on the first portion of the flexible substrate on a face opposite the face of the photoreceptor circuit, and wherein the light source circuit is only electrically connected via at least two conductive paths of the first portion to at least two contact pads of the photoreceptor circuit, and none of the electrical connection terminals of the second portion are connected to the light source circuit.

3. An optoelectronic module, including:
(a) a light source circuit;
(b) at least one photoreceptor circuit configured to pick up light originating from the light source circuit directly or via reflection on an external surface, having contact pads;
(c) a flexible substrate on which the photoreceptor circuit is directly mounted, wherein the substrate includes
a first portion on which the photoreceptor circuit is mounted and electrically connected, having contact pads corresponding to the contact pads of the photoreceptor circuit,
a second portion including electrical connection terminals, and
a connecting portion between the first portion and the second portion, having conductive paths,
wherein the contact pads of the photoreceptor circuit are electrically connected to the corresponding contact pads of the first portion, which are connected to the electrical connection terminals of the second portion via the connection paths of the connecting portion, wherein the connecting portion allows a height and/or spacing of the second portion to be adjusted relative to the first portion, wherein the width of the connecting portion is less than half the width of one side of the first portion from which the connecting portion is connected, and the connection portion is shifted relative to the center of the side of the first portion, wherein the optoelectronic module further includes an opaque cover arranged on the first portion of the flexible substrate on a side of the photoreceptor circuit, wherein the cover includes a light passage arranged above a photosensitive area of the photoreceptor circuit and made in an external projecting part of the cover, and wherein the cover includes two positioning pins arranged in proximity to two diametrically opposite corners inside a housing for the photoreceptor circuit, wherein each pin, which extends from a bottom of the housing towards the exterior of the housing, is of generally cylindrical shape and has a different diameter from the other pin, and wherein the first portion of the flexible substrate includes a first hole whose diameter corresponds to the diameter of one of the pins, and a second hole, whose diameter corresponds to the diameter of the other pin in order for the pins to pass therethrough in a well defined orientation and position.

4. The optoelectronic module according to claim 3, wherein a light source circuit is mounted in the housing of the cover on the same face of the first portion of the flexible substrate as the photoreceptor circuit, and wherein the cover includes an aperture for the passage of the light generated by the light source, said aperture being provided for receiving an optical lens portion of a transparent unit, and of larger dimensions than the transmission surface of the light source circuit.

5. The optoelectronic module according to claim 3, further including an opaque plate fitted with two through holes of the same diameter as the holes in the flexible substrate and positioned in the same manner as the holes of the flexible substrate, in order for the two pins of the cover to pass therethrough to enclose the first portion of the substrate between the cover and the plate.

* * * * *